United States Patent
Rinerson et al.

(10) Patent No.: US 7,075,817 B2
(45) Date of Patent: *Jul. 11, 2006

(54) TWO TERMINAL MEMORY ARRAY HAVING REFERENCE CELLS

(75) Inventors: Darrell Rinerson, Cupertino, CA (US); Christophe J. Chevallier, Palo Alto, CA (US); Steven W. Longcor, Mountain View, CA (US)

(73) Assignee: Unity Semiconductor Corporation

( * ) Notice: Subject to any disclaimer, the term of this patent is extended or adjusted under 35 U.S.C. 154(b) by 85 days.

This patent is subject to a terminal disclaimer.

(21) Appl. No.: 10/895,218

(22) Filed: Jul. 20, 2004

(65) Prior Publication Data

US 2006/0018149 A1 Jan. 26, 2006

(51) Int. Cl.
*G11C 11/00* (2006.01)

(52) U.S. Cl. .................... 365/158; 365/148

(58) Field of Classification Search ............ 365/148, 365/158
See application file for complete search history.

(56) References Cited

U.S. PATENT DOCUMENTS

| | | | |
|---|---|---|---|
| 3,886,577 A | 5/1975 | Buckley | |
| 5,296,716 A | 3/1994 | Ovshinsky et al. | |
| 6,055,178 A | 4/2000 | Naji | |
| 6,111,781 A | 8/2000 | Naji | |
| 6,204,139 B1 | 3/2001 | Liu et al. | |
| 6,445,612 B1 | 9/2002 | Naji | |
| 6,466,503 B1* | 10/2002 | Koizumi et al. | 365/208 |
| 6,473,332 B1 | 10/2002 | Ignatiev et al. | |
| 6,531,371 B1 | 3/2003 | Hsu et al. | |
| 6,753,561 B1 | 6/2004 | Rinerson et al. | |
| 6,807,088 B1 | 10/2004 | Tsuchida | |
| 6,836,421 B1 | 12/2004 | Rinerson et al. | |
| 6,856,536 B1 | 2/2005 | Rinerson et al. | |
| 6,972,985 B1* | 12/2005 | Rinerson et al. | 365/148 |
| 2003/0132456 A1 | 7/2003 | Miyai et al. | |
| 2004/0141369 A1 | 7/2004 | Noguchi | |
| 2005/0135148 A1 | 6/2005 | Chevallier et al. | |
| 2005/0151156 A1 | 7/2005 | Wu et al. | |

OTHER PUBLICATIONS

J.G. Simmons and R.R. Verderber, "New Conduction and Reversible Memory Phenomena in Thin Insulating Films," Proc. Roy. Soc. A., 301 (1967), pp. 77-102.

*Oxides and Oxide Films*, vol. 6, edited by Ashok. K. Vijh, Chapter 4 by David Oxley, "Memory Effects in Oxide Films," (Marcel Drekker 1981), pp. 251-325.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

(Continued)

*Primary Examiner*—Huan Hoang (57) ABSTRACT

A memory including reference cells is provided. The memory has address decoding circuitry and an array of memory cells that are non-volatile and re-writable. Each memory cell has a two terminal memory plug that is capable of experiencing a change in resistance. Sensing circuitry compares activated memory cells to a reference level. The reference level is typically generated by at least one reference cell that can be selected at the same time the memory cell is selected.

27 Claims, 6 Drawing Sheets

OTHER PUBLICATIONS

Liu et al., "Electric-pulse-induced reversible resistance change effect in magnetoresistive films," Applied Physics Letters, vol. 76, No. 19, May 8, 2000, pp. 2749-2751.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

Y. Watanabe, J.G. Bednorz, A. Bietsch, Ch. Gerber, D. Widmer, A. Beck, "Current-driven insulator-conductor transition and nonvolatile memory in chromium-doped $SrTiO_3$ single crystals," Applied Physics Letters, vol. 78, No. 23, Jun. 4, 2001, pp. 3738-3740.

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

U.S. Appl. No. 60/536,115, filed Jan. 13, 2004, Wu et al.

A. Baikalov, et al, "Field -driven hysteretic and reversible resistive switch at the Ag-Pr0.7Ca0.3MnO3 interface" Applied Physics Letters, vol. 83, No. 5, Aug. 4, 2003, pp. 957-959.

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

A. Sawa, et al, "Hysteretic current-volyage characteristics and resisitance switching at a rectifying $Ti/Pr_{0.7}Ca_{0.3}MnO_3$ interface" Applied Physics Letters, vol. 85, No. 18, Nov. 1, 2004, pp. 4073-4075.

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, "New Conduction and Reversible Memory Phenomena in Thin Insulating Films," Proc. Roy. Soc. A., 301 (1967), pp. 77-102.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

Liu et al., "Electric-pulse-induced reversible resistance change effect in magnetoresistive films," Applied Physics Letters, vol. 76, No. 19, May 8, 2000, pp. 2749-2751.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transition and nonvolatile memory in chromium-doped $SrTiO_3$ single crystals," Applied Physics Letters, vol. 78, No. 23, Jun. 4, 2001, pp. 3738-3740.

* cited by examiner

TWO TERMINAL MEMORY ARRAY HAVING REFERENCE CELLS

BACKGROUND OF THE INVENTION

1. Field of the Invention

The present invention relates to re-writeable non-volatile computer memory having very small feature sizes.

2. Description of the Related Art

Memory can either be classified as volatile or non-volatile. Volatile memory is memory that loses its contents when the power is turned off. In contrast, non-volatile memory does not require a continuous power supply to retain information. Most non-volatile memories use solid-state memory devices as memory elements.

Since the 1960s, a large body of literature has evolved that describes switching and memory effects in metal-insulator-metal structures with thin insulators. One of the seminal works was "New Conduction and Reversible Memory Phenomena in Thin Insulating Films" by J. G. Simmons and R. R. Verderber in 301 Proc. Roy. Soc. 77–102 (1967), incorporated herein by reference for all purposes. Although the mechanisms described by Simmons and Verderber have since been cast into doubt, their contribution to the field is great.

However, no one has successfully implemented a metal-insulator-metal structure into a commercial solid-state memory device. In the text "Oxides and Oxide Films," volume 6, edited by A. K. Vijh (Marcel Drekker 1981) 251–325, incorporated herein by reference for all purposes, chapter 4, written by David P. Oxley, is entirely devoted to "Memory Effects in Oxide Films." In that text, Oxley says "It is perhaps saddening to have to record that, even after 10 years of effort, the number of applications for these oxide switches is so limited." He goes on to describe a "need for caution before any application is envisaged. This caution can only be exercised when the physics of the switching action is understood; this, in turn, must await a full knowledge of the transport mechanisms operating in any switch for which a commercial use is envisaged."

In 2002, over twenty years after writing that chapter, Oxley revisited the subject in "The Electroformed metal-insulator-metal structure: A comprehensive model" by R. E. Thurstans and D. P. Oxley, 35 J. Phys. D. Appl. Phys. 802–809, incorporated herein by reference for all purposes. In that article, the authors describe a model that identifies the conduction process as "trap-controlled and thermally activated tunneling between metal islands produced in the forming process." "Forming" (or "electroforming") is described as "the localized filamentary movement of metallic anode material through the dielectric, induced by the electric field. Here it is important to note that the evaporated dielectric may contain voids and departures from stoichiometry. When resulting filaments through the dielectric carry sufficient current, they rupture to leave a metal island structure embedded in the dielectric. Electronic conduction is possible through this structure by activating tunneling."

However, the authors caution, "The forming process is complex and inherently variable. Also tunneling barriers are susceptible to changes in their characteristics when exposed to water vapour, organic species and oxygen . . . . Thus, device characteristics can never be expected to be produced consistently or be stable over long periods without passivation, effective encapsulation and a better understanding of the dynamics of the forming process."

In seemingly unrelated research, certain conductive metal oxides (CMOs), have been identified as exhibiting a memory effect after being exposed to an electronic pulse. U.S. Pat. No. 6,204,139, issued Mar. 20, 2001 to Liu et al., incorporated herein by reference for all purposes, describes some perovskite materials that exhibit memory characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and non-volatile memory in chromium-doped $SrTiO_3$ single crystals," Applied Physics Letters, Vol. 78, No. 23, 4 Jun. 2001, and "Electrical current distribution across a metal-insulator-metal structure during bistable switching," Journal of Applied Physics, Vol. 90, No. 6, 15 Sep. 2001, all of which are hereby incorporated by reference for all purposes.

There are continuing efforts to incorporate solid state memory devices into a commercial non-volatile RAM.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGs. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional non-volatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized.

Figure 1A:
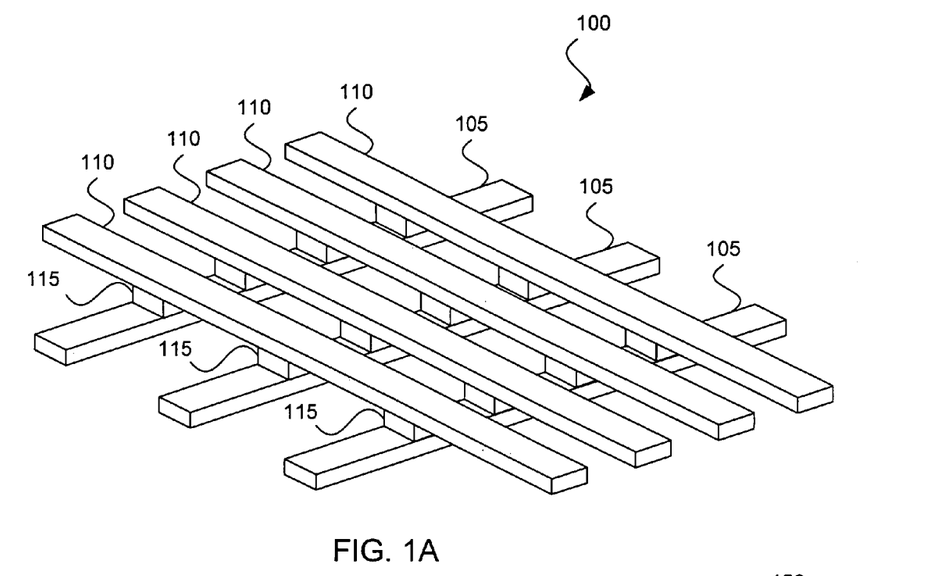
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array), which may be useful if they are made from different materials with different resistivities.

Figure 2A:
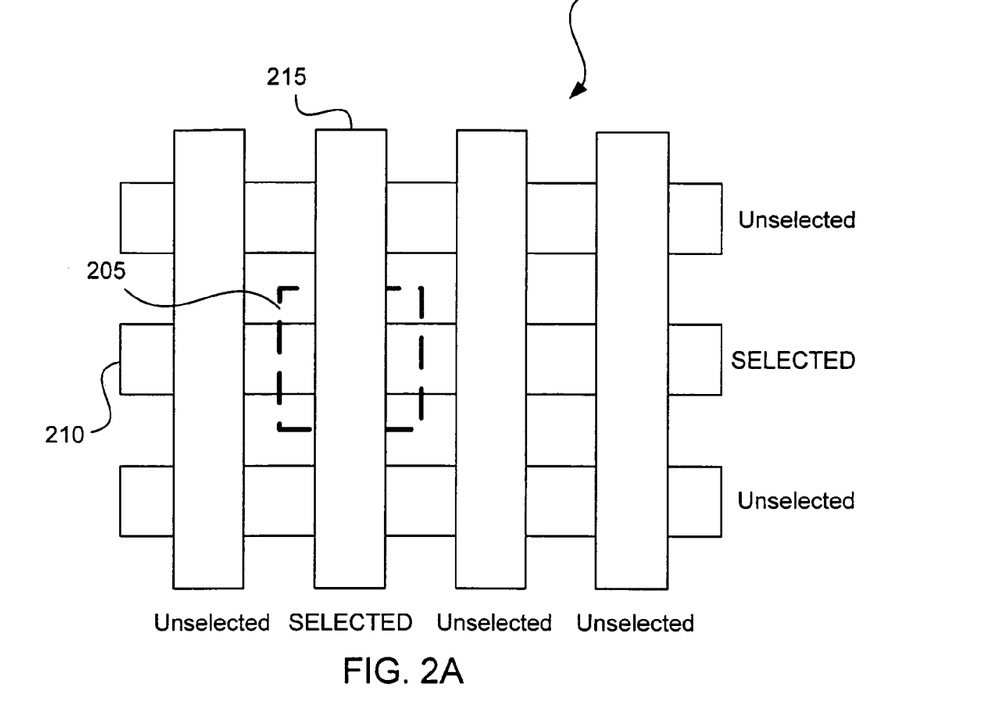
FIG. 2A depicts a plan view of selection of a memory cell in the cross point array depicted in FIG. 1A.
Figure 2B:
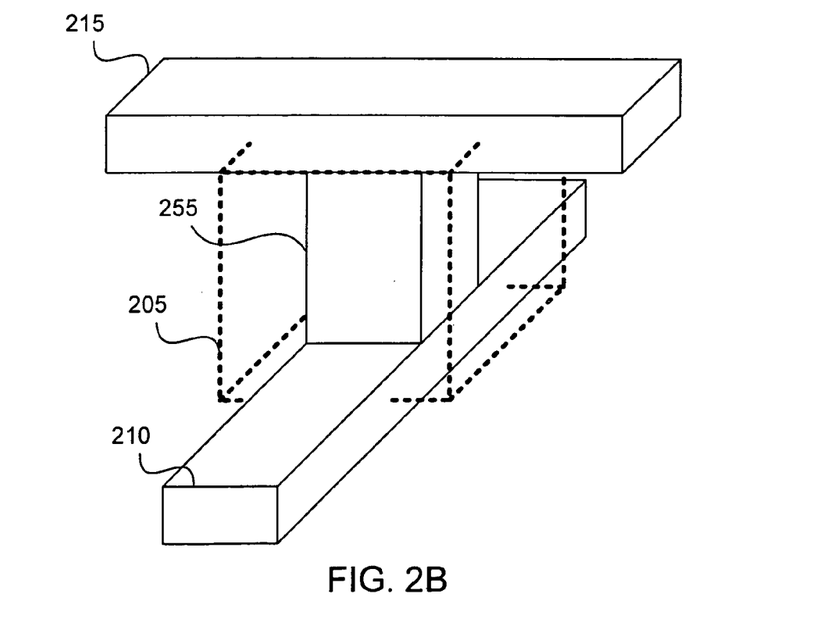
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110, creating a stacked cross point array.

Figure 1B:
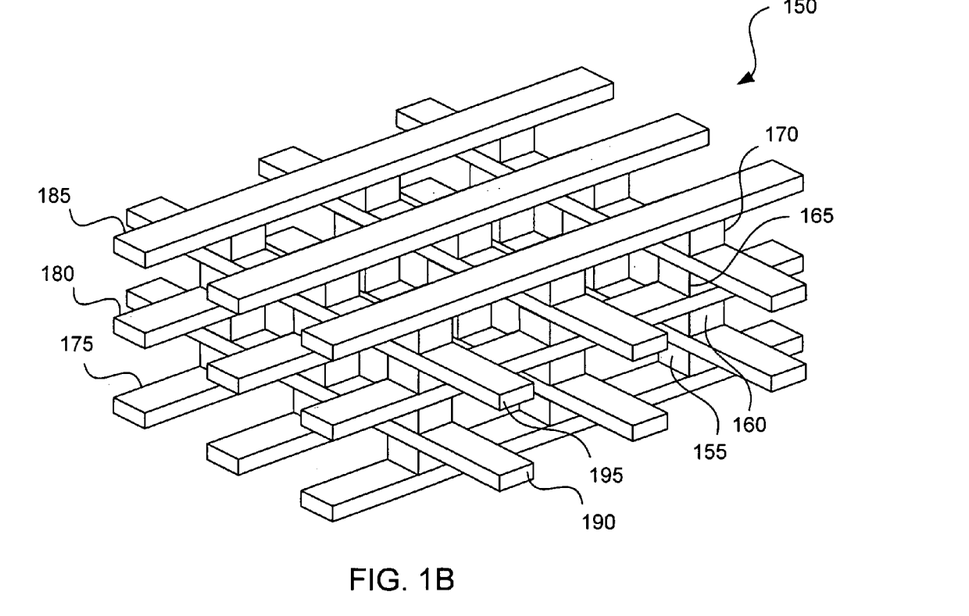
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. However, the cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
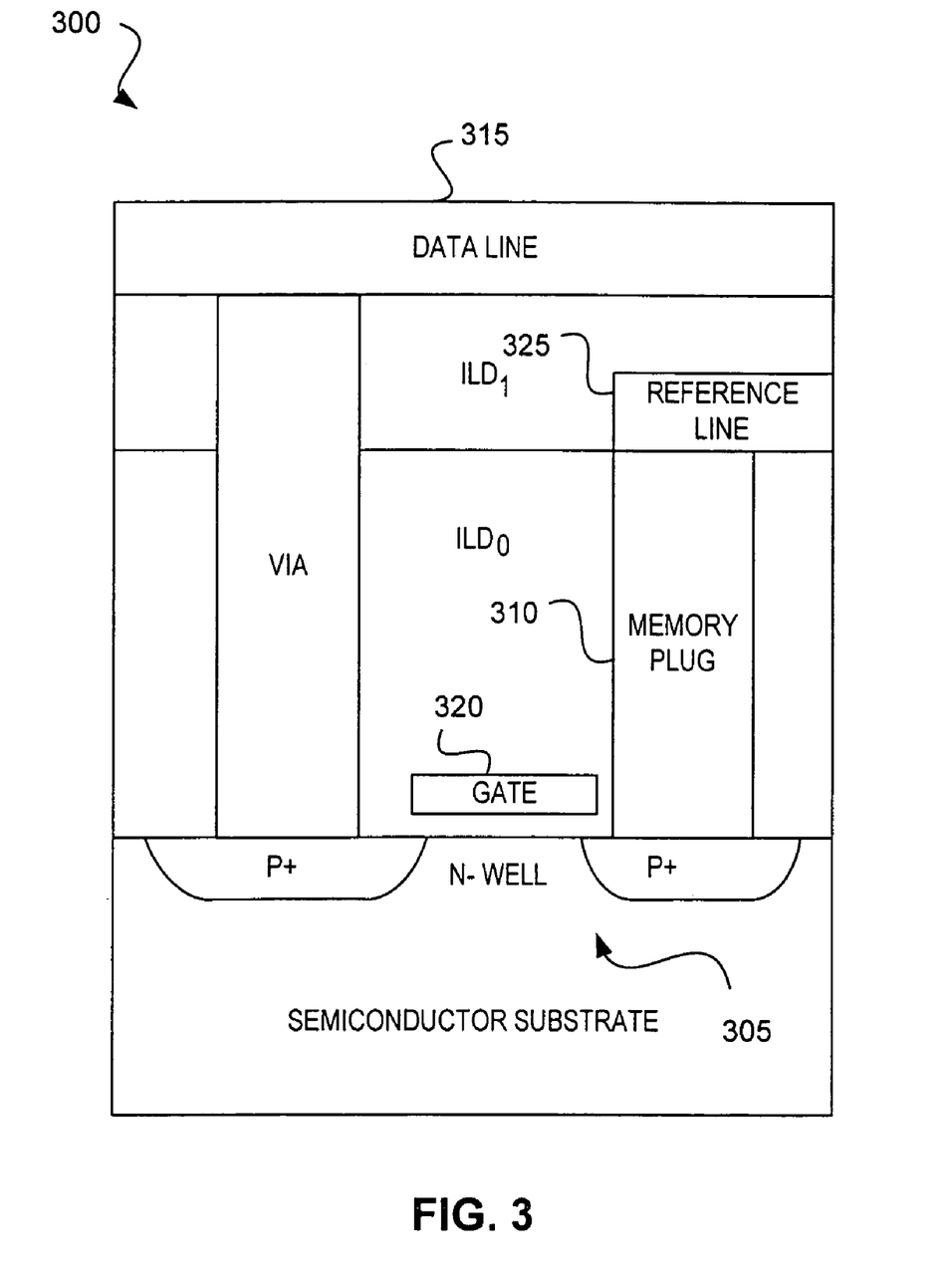
FIG. 3 depicts a generalized cross-sectional representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other.

Memory Chip Configuration

Figure 4A:
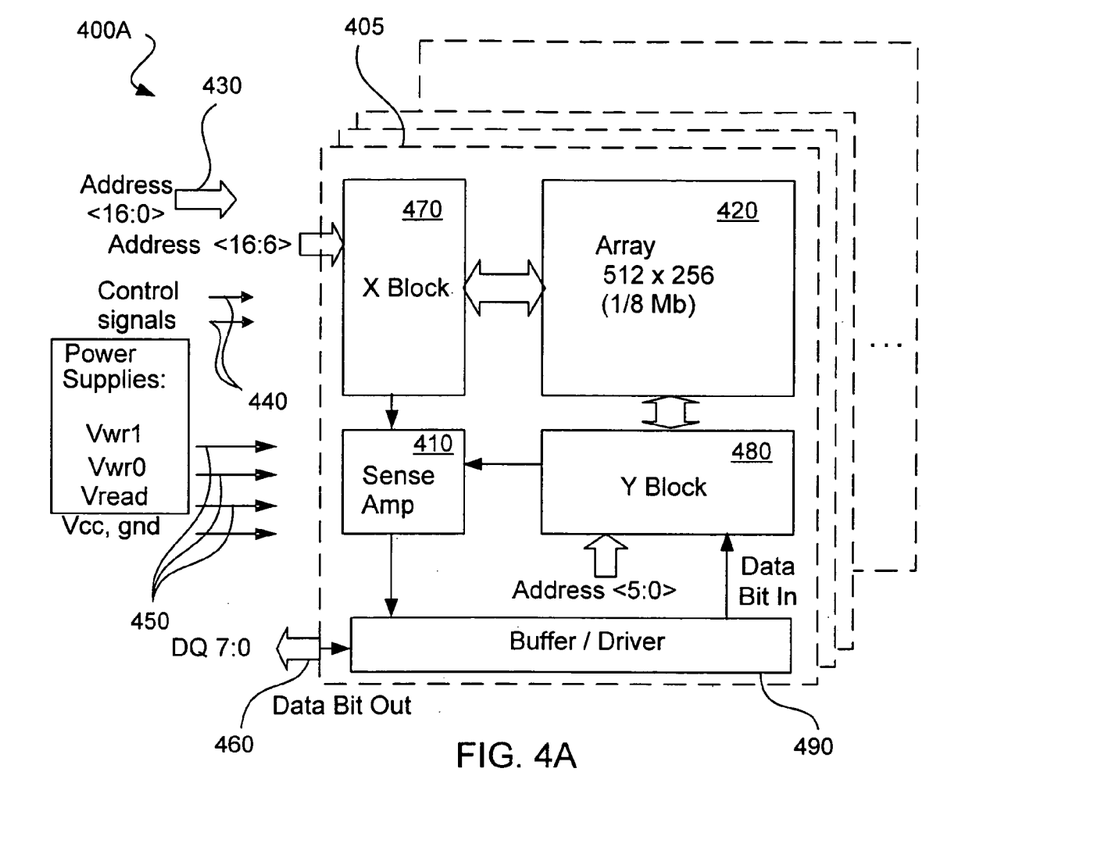
FIG. 4A depicts a block diagram of a representative implementation of an exemplary 1 MB memory.

FIG. 4A is a block diagram of a representative implementation of an exemplary 1 MB memory 400A. Physical layouts might differ, but each memory bit block 405 can be formed on a separate portion of a semiconductor substrate. Input signals into the memory 400A can include an address bus 430, a control bus 440, some power supplies 450, and a data bus 460. The control bus 440 typically includes signals to select the chip, to signal whether a read or write operation should be performed, and to enable the output buffers when the chip is in read mode. The address bus 430 specifies which location in the memory array is accessed—some addresses going to the X block 470 (typically including a predecoder and an X-decoder) to select one line out of the horizontal array lines. The other addresses go to a Y block 480 (typically including a predecoder and a Y-decoder) to apply the appropriate voltage on specific vertical lines. Each memory bit block 405 operates on one line of the memory chip data bus 460.

Figure 4B:
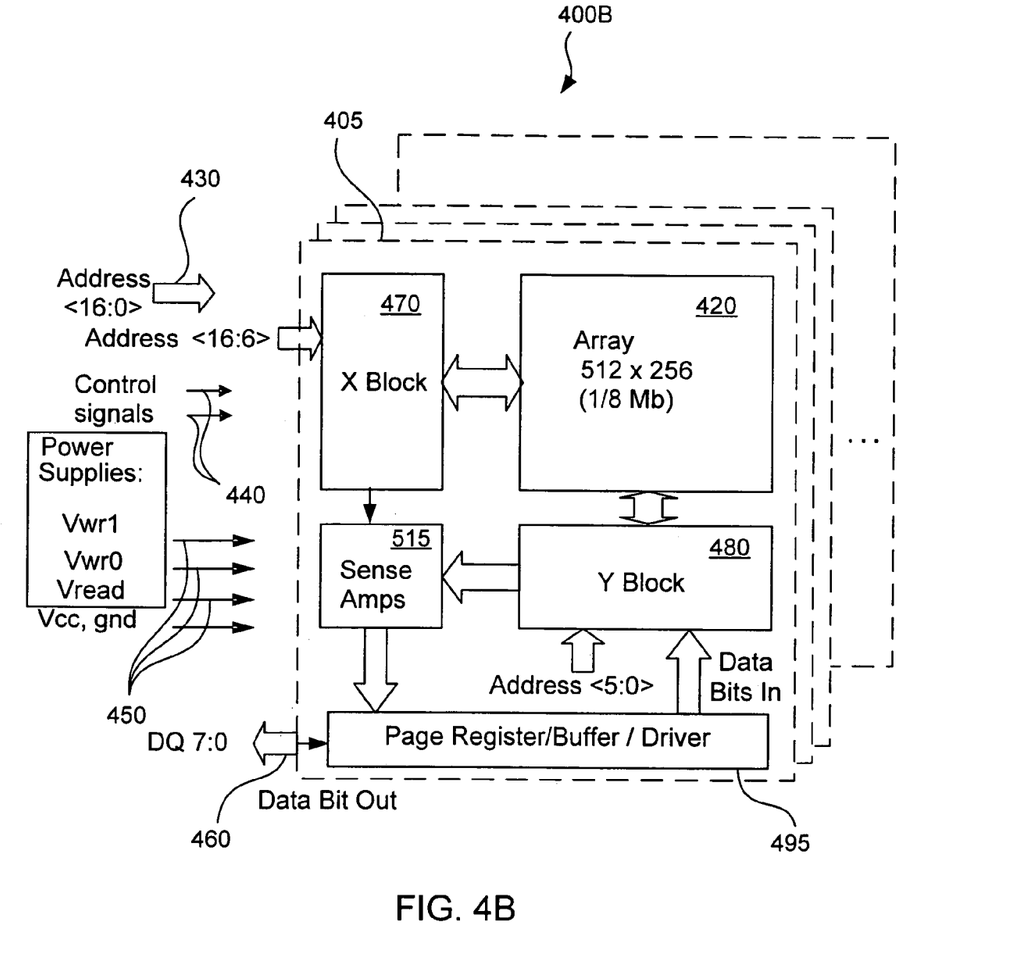
FIG. 4B depicts a block diagram of an exemplary memory that includes sensing circuits that are capable of reading multiple bits.

The reading of data from a memory array 420 is relatively straightforward: an x-line is energized, and current is sensed by the sensing circuits 410 on the energized y-lines and converted to bits of information. FIG. 4B is a block diagram of an exemplary memory 400B that includes sensing circuits 415 that are capable of reading multiple bits. The simultaneous reading of multiple bits involves sensing current from multiple y-lines simultaneously.

During a write operation, the data is applied from the data bus 460 to the input buffers and data drivers 490 to the selected vertical lines, or bit lines. Specifically, when binary information is sent to the memory chip 400B, it is stored in latch circuits within the circuits 490. Each y-line can either have an associated driver circuit 490 or a group of y-lines can share a single driver circuit 490 if the non-selected lines in the group are held to a constant voltage that would not cause the unselected memory plugs to experience any change in resistance. The driver circuit then writes the 1 or 0 to the appropriate memory plug during the appropriate cycle. For example, there may be 1024 y-lines in a cross point array, and the page register may include 8 latches, in which case the y-block would decode 1 out of 128 y-lines and connect this selected line to block 490. As described below, certain memory plugs can have multiple stable distinct resistive states. With such multi-level resistance memory plugs, driver circuits could program, for example, states of 00, 01, 10 or 11 by varying write voltage magnitude or pulse length.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Reference Cells

Figure 5A:
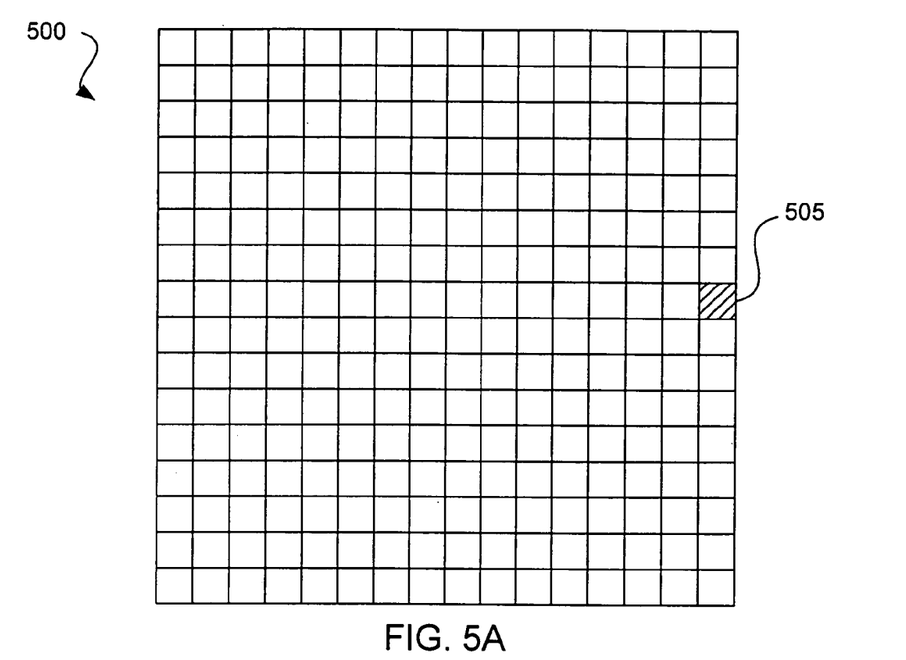
FIG. 5A depicts a block diagram of an exemplary memory array that has a single reference cell.

Reference cells can improve the performance of both a cross point memory array and a transistor memory array. FIG. 5A is a block diagram of an exemplary memory array 500 using a single reference cell 505. Reference cells provide a reference level to the system. Since the reference level is known, the resistance state of other memory cells can be determined by comparing their resistances to the known reference levels.

A simple way to provide a reference would be to build a resistance using a diffusion layer, polysilicon layer or any device having a known resistance. Alternatively, a resistance level could be achieved with a known current source and a know voltage source, since the resistance is a voltage over a current. However, to better track the actual memory cells and compensate for fabrication and environmental differences, it is preferable to use the same type of material in the reference cell 505 that is used in the memory cells of the memory array. Moreover, even better uniformity can be achieved if the reference cell 505 were not just the same type of material, but if it were actually fabricated to have the same structure as every other memory cell of the memory array.

Various techniques could be used to set the resistance of the reference cell 505 to a known value. For example, special circuits could be used to program the reference cell to the desired value. In the case of binary memory cells that are only programmed to either a high state or a low state, it is sometimes advantageous to have the reference cell programmed to a mid-point in-between the states. Sensing could be achieved very quickly because the system would not need to wait until the sensing circuits settled on a high value or a low value, but instead could trigger a high or low signal depending upon whether the sensing circuit signal started to rise from the reference signal to the high signal or fall from the reference signal to the low signal.

However, in a binary system special circuits would generally be required to program the reference cell 505 to a middle state since the other array circuits would be designed to only program memory cells to a high state or a low state.

Special circuitry would not be required if the reference cell came out of fabrication with the appropriate resistance, either by inherently having the correct resistance or by implementing various processing techniques to program the reference cell during fabrication. Special circuitry would also not be required if two reference cells were used. If one was programmed to a high resistive state and the other was programmed to a low resistive state, then the two cells could be electrically combined to produce an appropriate equivalent resistance. Additionally, reference cells programmed to a high resistive state could be used as a "write high verify" to ensure memory cells are programmed correctly. Reference cells programmed to a low resistive state could be used as a "write low verify" in a similar manner. Although these write verify reference cells would preferably be the same reference cells that are combined and used in a read, separate reference columns could be used for read and write operations. Redundant cells could also be combined so that any effects from fabrication defects of a single cell would be minimized. For simplicity, a "reference cell" is described herein as being singular, but can include multiple reference cells that are combined to produce an appropriate reference level.

Figure 5B:
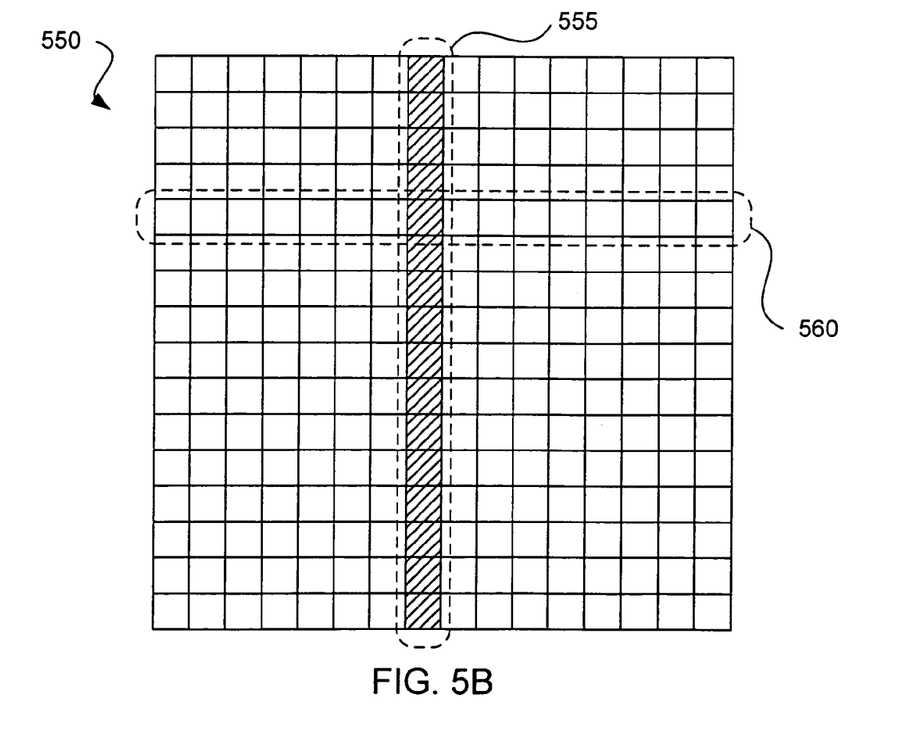
FIG. 5B depicts a block diagram of an exemplary memory array that has a reference column.

It is often more convenient and more accurate to employ a column of reference cells instead of one reference cell 505 for the entire array. In this manner, each row would contain its own reference cell. FIG. 5B is a block diagram of an exemplary memory array 550 using a reference column 555. Although the reference column 555 is shown as being located near the center of the array, it can be placed anywhere on the array. However, placing the reference column 555 at the center provides it with both a closer match in physical characteristics to other cells in the array, eliminates any edge effects, and reduces the distance of the conductive line path from edge columns to the reference column 555.

In the arrangement of FIG. 5B, an X-line 560 can be energized to apply a read voltage to all of its memory cells, including its associated reference cell such that all the devices on the X-line shared the same voltage. The resulting voltages from any energized Y-lines are then sensed by a sense amp or plurality of sense amps. A sense amp is any component or group of components for determining the current or voltage of a memory cell relative to the reference level of the reference cell. In one embodiment, each Y-line is placed in electrical communication with an input of a differential amplifier, with the other input being the voltage from the reference column 555. The selected Y-line(s) and the reference column are biased to induce a current flow in the associated memory plugs of the memory cell(s) and reference cell. When this technique is used the current in the selected cell is read on the selected y-line in parallel with the reference column in line 555. The output of each differential amplifier thus measures the difference in voltage between the output voltage of each memory cell and the output voltage of the reference cell. Those skilled in the art will appreciate that sensing can also be accomplished through current sensing.

Memory Plug

Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½$V_W$. The other memory plugs would exhibit such high resistances from the non-ohmic characteristic that current would not flow through the half-selected plugs.

A non-ohmic device might be used to cause the memory plug to exhibit a non-linear resistive characteristic. Exemplary non-ohmic devices include three-film metal-insulator-metal (MIM) structures and back-to-back diodes in series. Separate non-ohmic devices, however, may not be necessary. Certain fabrications of the memory plug can cause a non-ohmic characteristic to be imparted to the memory cell. While a non-ohmic characteristic might be desirable in certain arrays, it may not be required in other arrays.

Electrodes will typically be desirable components of the memory plugs, a pair of electrodes sandwiching the memory element. If the only purpose of the electrodes is as a barrier to prevent metal inter-diffusion, then a thin layer of non-reactive metal, e.g. TiN, TaN, Pt, Au, and certain metal oxides could be used. However, electrodes may provide advantages beyond simply acting as a metal inter-diffusion barrier. Electrodes (formed either with a single layer or multiple layers) can perform various functions, including: prevent the diffusion of metals, oxygen, hydrogen and water; act as a seed layer in order to form a good lattice match with other layers; act as adhesion layers; reduce stress caused by uneven coefficients of thermal expansion; and provide other benefits. Additionally, the choice of electrode layers can affect the memory effect properties of the memory plug and become part of the memory element.

Memory Effect

The memory effect is a hysteresis that exhibits a resistive state change upon application of a voltage while allowing non-destructive reads. A non-destructive read means that the read operation has no effect on the resistive state of the memory element. Measuring the resistance of a memory cell is generally accomplished by detecting either current after the memory cell is held to a known voltage, or voltage after a known current flows through the memory cell. Therefore, a memory cell that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. It should be appreciated that the magnitude of $|-V_R|$ does not necessarily equal the magnitude of $|+V_R|$.

Furthermore, it is possible to have a memory cell that can be switched between resistive states with voltages of the same polarity. For example, in the paper "The Electroformed metal-insulator-metal structure: a comprehensive model," (already incorporated by reference) Thurstans and Oxley describe a memory that maintains a low resistive state until a certain $V_P$ is reached. After $V_P$ is reached the resistive state can be increased with voltages. After programming, the high resistive state is then maintained until a $V_T$ is reached. The $V_T$ is sensitive to speed at which the program voltage is removed from the memory cell. In such a system, programming $R_1$ would be accomplished with a voltage pulse of $V_P$, programming $R_0$ would be accomplished with a voltage pulse greater than $V_P$, and reads would occur with a voltages below $V_T$. Intermediate resistive states (for multi-level memory cells) are also possible.

The $R_1$ state of the memory plug may have a best value of 10 kΩ to 100 kΩ. If the $R_1$ state resistance is much less than 10 kΩ, the current consumption will be increased because the cell current is high, and the parasitic resistances will have a larger effect. If the R state value is much above 100 kΩ, the RC delays will increase access time. However, workable single state resistive values may also be achieved with resistances as low as 5 kΩ and as high as 1 MΩ. Typically, a single state memory would have the operational resistances of $R_0$ and $R_1$ separated by a factor of 10.

Since memory plugs can be placed into several different resistive states, multi-bit resistive memory cells are possible. Changes in the resistive property of the memory plugs that are greater than a factor of 10 might be desirable in multi-bit resistive memory cells. For example, the memory plug might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000.

Although the memory effect properties of the memory plug appear to be dominated by carrier trapping, other carrier transport mechanisms such as oxygen migration or electrolyte migration may be present. Even within carrier charge trapping, dominant factors can include space-charge limited currents, thermionic emission limited conduction, electrothermal Poole-Frenkel emission, or Fowler-Nordheim quantum tunneling. While the inventors note that experimental data is consistent with memory effects being created primarily by carrier trapping, they do not wish to be bound by any explanation of how a memory effect is created or how any other effect that is described herein functions.

As previously described, forming is one technique that can be used in metal-insulator-metal structures in order to induce a memory effect. However, it is generally not practical to form a structure within a commercial memory product. Therefore, processing techniques are required to either eliminate the need for forming or create conditions that make forming possible in high-volume manufacturing.

Creating the Memory Effect

Interfacial layers are one mechanism that can be used to create a memory effect. An interface layer is typically a very thin layer because the reaction that is created by placing the oxide in contact with the reactive metal only extends a short distance, typically less than 100 angstroms. The thickness of the interfacial layer can be controlled by limiting the thickness of the reactive metal. Although the interfacial layer can be placed into different resistive states, even the lowest resistive state is typically very insulating. Accordingly, a thick interfacial layer would not allow any current to pass through the memory cell in an optimal period of time. To allow rapid access times (on the order of tens of nanoseconds, typically below 100 ns) in small dimension devices (on the order of hundreds of nanometers), the entire memory plug should have a resistivity of not more than about 1 ohm-cm.

The oxide will generally (but not necessarily) be a conductive crystalline metal oxide—either as a single crystalline structure or a polycrystalline structure. One class of conductive oxides are perovskites that include two or more metals, the metals being selected from the group consisting of transition metals, alkaline earth metals and rare earth metals.

The perovskites (generally in the form of $ABX_3$ structures, where A has an atomic size of 1.0–1.4 Å and B has an atomic size of 0.45–0.75 Å for the case where X is either oxygen or fluorine) can be any number of compositions, including manganites (e.g., $Pr_{0.7}Ca_{0.3}MnO_3$, $Pr_{0.5}Ca_{0.5}MnO_3$ and other PCMOs, LCMOs using lanthanum and calcium as A, etc.), titanates (e.g., $SrTiO_3$), and zirconates (e.g., $SrZrO_3$). Some perovskites can be doped with various elements, such as Nb, in order to make them less insulating. $MnO_3$, when combined with the rare earth metals La, Pr or some combination thereof and the alkaline earth metals Ca, Sr or some combination thereof have been found to be particularly effective for use in the memory plug.

Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, oxides that are classified as insulators, but are thin enough to allow tunneling conduction, can still be considered conductive oxides. Since a memory plug will need to be able to be switched at low currents, low resistances are desirable—making conductive oxides more attractive than insulating oxides.

Whether a metal is a reactive metal is determined by its relation to the perovskite, and whether the metal is a strong enough reducing agent to reduce the semiconductive metal oxide and be oxidized. For example, Al will reduce a PCMO perovskite. Other reactive metals, depending on the semiconductive metal oxide, can include Ta, Ti, Zr, Y, Hf, Cr and Mg. It should be appreciated that the resulting interfacial layer may not have well-defined stoichiometry, but can be more like a "soup" of Al, Pr, Ca and Mn oxides.

In one embodiment, the interfacial layer can be considered to be between the unaltered conductive oxide and the reactive metal (or reactive metal oxide, depending on the deposition technique) that does not contain any conductive oxide. If, however, only a small amount of reactive metal is deposited such that all of the reactive metal is reacted, then the interfacial layer will be between the unaltered conductive oxide and an electrode on top of the interfacial layer.

However, it should be appreciated that using a reactive metal may not be the only way to create a memory effect with a conductive oxide. Insulating and semiconductive layers having the memory effect might be able to be created through doping, implantation or use of other techniques and treatments.

For example, strontium titanate (STO) or strontium zirconate (SZO) can be doped by adding an element that has a different preferred oxidation state (a different charge when ionized) when it replaces an element in the crystal matrix. Typically, the dopant would make up less than 10% molecular percentage of the total material. In SZO, chromium (Cr), with a +3 oxidation state, can replace zirconium (Zr) with a +4 oxidation state. Charge imbalance is compensated by either creation of appropriate vacancies (e.g., oxygen vacancies), by change of valence on a matrix element, or by introduction of free carriers (electrons or holes).

A dopant atom usually substitutes for a matrix element based, at least partly, on the similarity of ionic radii. Thus lanthanum (La) primarily substitutes for strontium (Sr) whereas Cr primarily substitutes for Zr in SZO. In SZO, cation vacancies are rare (i.e., there are few Sr and Zr vacancies), but anion vacancies (i.e., oxygen) are common. Therefore, adding Cr to SZO generates both oxygen vacancies and free holes. However, Cr addition is usually compensated by oxygen vacancies (one vacancy for every two Cr atoms) such that the material remains essentially insulating. In contrast, free electrons primarily compensate for La in SZO. Therefore adding La drastically lowers the resistance of SZO. Similarly tantalum (Ta) or niobium (Nb) can substitute for Zr to lower SZO resistivity.

Further, vacancies (either anion or cation) can also act to create charge traps. The charge imbalance caused by a vacancy can be compensated by the same mechanisms that compensate for the intentional additions of a dopant. Thus, an oxygen vacancy compensated by 2 Cr atoms provides no free carriers, but if there is insufficient Cr for full compensation, oxygen vacancies lead to free electrons.

Some dopants create centers at deep levels in the bandgap. Such dopants create centers where a charge would need a high level of energy to exit that level, effectively creating traps with the deep levels. For example, Cr, iron (Fe), or nickel (Ni) can create traps in STO and SZO. To the contrary, yttrium (Y), La, Nb and Ta would create centers at shallow levels, which would not be traps.

Treatment can additionally occur through, for example, ion implantation. In ion implantation accelerated ions penetrate a solid surface up to certain depth that is determined by the ion energy. Ion implantation can be used to introduce dopants, to form buried layers, and to modify solid surfaces.

Another treatment method is to expose a reactive metal or a conductive oxide to either an anneal or a gas at a given temperature within a given ambient. Some anneals can be easily integrated into fabrication. For example, if the array only has a single memory plug layer, then the bottom layers might be subjected to high temperatures in order to properly form the conductive oxide. However, the top layers can then be deposited at temperatures far below what is necessary for forming the conductive oxide. Similar results can be obtained by laser treating one of the surfaces, or exposing one of the surfaces to a plasma process (such as plasma etching).

Another treatment method might be to expose the entire structure and/or a particular surface layer to a physical re-sputtering, typically by using Ar and/or $O_2$ or other inert gas plasma. Re-sputtering is a technique commonly used to clean-up surfaces. Since a new film is not deposited when the plasma hits the surface in the sputtering chamber, it can be considered to be the opposite of sputtering. Similarly, the surface can be exposed to an inert ion from an ion gun, bombarding the surface with accelerated inert ions, such as ionized Ar.

Typically, the goal of such treatments is to create traps. Traps can also be introduced with high energy radiation or particle beam bombardment. For example, UV and X-ray radiation induces traps in $SiO_2$. Also, neutron transmutation doping can be used to create dopant atoms in silicon. Furthermore, traps can be created by an electrical initialization process during which oxygen vacancies drift through an oxide in the presence of an applied electric field. Of course, the dominant carrier mechanisms may change depending upon the treatment of the interface layer.

A memory plug, therefore, has many similarities with a traditional MIM structure. However, it should be noted that many memory plugs exhibit memory characteristics regardless of whether they have been formed. It should be appreciated that the term "memory element" includes all the layers that contribute to the memory effect. Such layers, depending on the specific embodiment, can include the interface layer, the conductive oxide, reactive metal layer and/or electrodes.

Depositing conductive islands of one material within the bulk of a second, less conductive material is another way of creating the memory effect. Islands (as opposed to a continuous thin film) can be formed by a number of different processes, including sputtering, co-sputtering, evaporation, molecular beam epitaxy, atomic layer deposition, implantation, etc, and are typically related to the surface energies of the two materials. Those skilled in the art will appreciate that a first material can form islands on the surface of a second material under some processes and not others.

The density of the islands will typically be less than the percolation threshold (the point at which a continuous path of nearest neighbors could be formed from one side to another). Once the percolation threshold is reached, the layer becomes more like a thin film and less like an island structure. The size of the islands will typically be nano-structures, between 0.5 and 50 nanometers thick.

In one specific embodiment, a portion of a semiconductive material is first deposited on an electrode. Then, conductive islands are formed on the semiconductive material. After the islands are formed, another portion of the same semiconductive material is deposited on the islands. Then, either a top electrode is formed or additional island/semiconductive material layers are formed prior to the top electrode.

Conductive metal islands can then be formed by depositing any number of different materials on the surface of the perovskite. A reactive metal, for example, will create a strong memory effect. However, a metal having a purely ohmic connection with the perovskite will generally not have any memory effect.

In another specific example, a damascene process could be employed where an interlayer dielectric such as $SiO_2$ is patterned in order to create voids over the bottom electrodes. Aluminum oxide can then be deposited and polished off the $SiO_2$ surface such that a portion of the void is filled with aluminum oxide. A small amount of conductive metal or oxide could then be formed on top of the aluminum oxide, which will preferentially nucleate into an array of island formations on the aluminum oxide. Another layer of aluminum oxide could then be sputtered to fill more the void, followed by another polish and then another deposition of islands. A final layer of aluminum oxide could then be deposited to completely fill the void, followed by a final polish so that the $SiO_2$/aluminum oxide surface was smooth.

It should also be appreciated that a reactive metal may not be creating the semiconductive metal islands (for example, $AlO_2$ may be more insulating than the PCMO perovskite, but the remaining elements of Pr, Ca and Mn may themselves form a conductive island). While this is one possible explanation of the reaction that occurs within the various materials, the inventors do not wish to be bound by any explanation of how conductive islands are formed when a reactive metal is deposited on a semiconductive metal oxide.

Another possible explanation is that the conductive islands are surrounded by an insulating envelope. If such a reaction were occurring in the above example, then the islands would consist of conductive Al cores surrounded by an insulating skin of $AlO_2$, embedded within the semiconductive PCMO perovskite.

Alternatively, a memory effect can be created with a non-reactive metal, such as gold, silver or platinum. The non-reactive metal would not react with the underlying perovskite, but instead (depending on surface energies) simply preferentially nucleate into an array of conductive island structures. Although such non-reactive metals may not create as strong a memory effect, stronger memory effects can be created by increasing the size of the islands, creating multiple layers of islands, and/or modifying the Schottky barrier between the metal and the surrounding semiconductor.

Filamentary forming is yet another mechanism than could be used to induce a memory effect. Although forming is typically associated with insulators within an MIM structure, semiconductors are generally preferable in a memory plug because the low resistive state allows a faster access time. However, those skilled in the art will also appreciate that very thin insulators can be conductive due to charge tunneling and certain types of insulators, when placed in contact with certain electrodes, will have an appropriate work function at the electrode/insulator interface that allows charge injection.

Elemental semiconductors include antimony, arsenic, boron, carbon, germanium, selenium, silicon, sulfur, and tellurium. Semiconductor compounds include gallium arsenide, indium antimonide, and the oxides of most metals. Additionally, some perovskites also exhibit semiconductive properties.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A memory comprising:
  address lines operable to carry addresses;
  control lines operable to carry control signals;
  data lines operable to carry data;
  a memory array that is accessed by array lines;
  an address decoder that decodes the address on the address lines and activates certain array lines;
  drivers that, as a function of the control signals, are operative to cause some array lines to be placed at a first write voltage, a second write voltage, or a read voltage;
  a plurality of two-terminal memory plugs within the memory array, each two-terminal memory plug electrically connected to at least one array line, the two-terminal memory plug being able to be reversibly written to a first resistive state when the some array lines are at the first write voltage, reversibly written to a second resistive state when the some array lines are at the second write voltage, and have its resistive state undisturbed when the some array lines are at the read voltage, wherein a read output is produced when the some array lines are at the read voltage;
  a reference cell within the memory array that contributes to a reference level; and
  sensing circuitry that compares the read output to the reference level and produces data.

2. The memory of claim 1, wherein a plurality of reference cells are within the memory array.

3. The memory of claim 2, wherein:
the memory array has two opposite edges and a middle that is approximately equidistant from the two opposite edges; and
wherein the reference cell is located in the middle of the array.

4. The memory of claim 2, wherein the plurality of reference cells and the plurality of two-terminal memory plugs are made from the same materials.

5. The memory of claim 4, wherein the plurality of reference cells and the plurality of two-terminal memory plugs are fabricated to have the same physical structure.

6. The memory of claim 1, wherein:
the first write voltage places the two-terminal memory plugs in a high resistive state;
the second write voltage places the two-terminal memory plugs in a low resistive state; and
the effective resistance of the reference level is intermediate to the high resistive state and the low resistive state.

7. The memory of claim 6, wherein:
the reference level is derived from a combination of reference memory cells, some of which are in the low resistive state and some of which are in the high resistive state.

8. The memory of claim 6, wherein:
the resistive states of each of the reference cells are intermediate to the high resistive state and the low resistive state.

9. The memory of claim 1, wherein the memory array is a cross point memory array.

10. The memory of claim 1, wherein the memory array is a single transistor memory array.

11. A memory comprising:
address lines;
address decoding circuitry in communication with the address lines;
addressable two-terminal memory plugs that are activated by the address decoding circuitry, each two-terminal memory plug operable to be reversibly written to a first resistive state at a first write voltage, reversibly written to a second resistive state at a second write voltage, and have its resistive state determined at a read voltage; and
sensing circuitry that produces an output that is a function of the resistive state of the activated two-terminal memory plug and a reference level.

12. The memory of claim 11 wherein tie reference level is derived from at least one reference cell.

13. The memory of claim 12, wherein the at least one reference cell is similar Is structure to the two-terminal memory plugs.

14. The memory of claim 13 wherein the two terminal memory plugs are organized in an array and the least one reference cell is located within the array.

15. The memory of claim 11 wherein the reference level has an effective resistance that is intermediate to the first resistive stat, and the second resistive state.

16. A method of outputting data comprising:
providing a non-volatile memory cell that includes a two-terminal memory plug that is operable to reversibly change Its resistive state responsive to a voltage applied across the two terminals;
receiving an address that identifies at least one memory cell out of an array of memory cells;
energizing the at least one memory cell in order to produce a memory cell output;
energizing at least one reference cell that contributes to a reference level; and
outputting data that is dependant on the memory cell output and the reference level.

17. The method of claim 16 wherein at least two reference cells are energized to contribute to the reference level.

18. The method of claim 17 wherein:
the memory cells can be placed in at least a high resistive state and a low resistive state;
at least one of the at least two reference cells is in the high resistive state and;
at least one of the at least two reference cells is in the low resistive state.

19. The method of claim 18 wherein at least one of the at least two reference cells is a resistive state intermediate to the high resistive state and the low resistive state.

20. The method of claim 16 wherein:
the array of memory cells are arranged in rows and columns; and
a column of reference cells with the memory array includes the at least one reference cell.

21. The method of claim 20 wherein the at least one memory cell and the at least one reference cell are contained in the same row, whereby energizing the at least one reference cell and the at least one memory cell occur by selecting the row.

22. The method of claim 21 wherein:
the memory array has two edge columns and a center column that is approximately equidistant from both edge columns; and
the reference column is also the center column.

23. The method of claim 21 wherein:
the memory cells can be placed in at least a high resistive state and a low resistive state;
the reference cells in the reference column are in the high resistive state; and
reference cells in a second reference column are in the low resistive state.

24. The method of claim 23 wherein:
reference cells in the high resistive state are used to verify a memory cell has been written to the high resistive state;
reference cells in the low resistive state are used to verify a memory cell has been written to the low resistive state; and
a combination of reference cells in the high resistive state and reference cells in the low resistive state are used in read operations.

25. The method of claim 23 wherein:
reference cells in a third reference column are in a resistive state intermediate to the high resistive state and the low resistive state;
reference cells in the high resistive state are used to verify a memory cell has been written to the high resistive state;
reference cells in the low resistive state are used to verify a memory cell has been written to the low resistive state; and
reference cells in the intermediate resistive state are used to verify a memory cell has been written to the low resistive state are used in read operations.

26. The method of claim 23 wherein the memory array is a cross point array.

27. The method of claim 16 wherein the reference cell is located within the array of memory cells.

* * * * *

UNITED STATES PATENT AND TRADEMARK OFFICE
CERTIFICATE OF CORRECTION

| | | |
|---|---|---|
| PATENT NO. | : 7,075,817 B2 | |
| APPLICATION NO. | : 10/895218 | |
| DATED | : July 11, 2006 | |
| INVENTOR(S) | : Darrell Rinerson et al. | |

It is certified that error appears in the above-identified patent and that said Letters Patent is hereby corrected as shown below:

Kindly Correct the following Errors on part of the USPTO as set forth in (a) - (c) below:

(a) In regards to Claim 12 in the Claims,

In Column 13, Line 48, Please DELETE the word "tie" and REPLACE with the word --the--.

(b) In regards to Claim 15 in the Claims,
In Column 13, Line 58, Please DELETE the word "stat," and REPLACE with the word --state,--.

(c) In regards to Claim 16 in the Claims,

In Column 13, Line 62, Please DELETE the upper case word "its"and REPLACE with the lower case word "its".

Kindly Correct the following Errors on part of the APPLICANT as set forth in (d) - (e) below:

(d) In regards to Claim 13 in the Claims,

In Column 13, Line 50, AFTER the word "similar", please DELETE the word "Is" and REPLACE with the word "in".

UNITED STATES PATENT AND TRADEMARK OFFICE
CERTIFICATE OF CORRECTION

| | |
|---|---|
| PATENT NO. | : 7,075,817 B2 |
| APPLICATION NO. | : 10/895218 |
| DATED | : July 11, 2006 |
| INVENTOR(S) | : Darrell Rinerson et al. |

It is certified that error appears in the above-identified patent and that said Letters Patent is hereby corrected as shown below:

(e) In regards to Claim 19 in the Claims,

In Column 14, Line 15, please DELETE the word "is" and REPLACE with the word "has".

Signed and Sealed this

Fifth Day of December, 2006

JON W. DUDAS
*Director of the United States Patent and Trademark Office*